United States Patent [19]

DeVries et al.

[11] 4,336,515

[45] Jun. 22, 1982

[54] ACOUSTIC FILTER WITH HARMONIC REJECTION

[75] Inventors: Adrian J. DeVries, Mount Prospect; Kai Hansen, Arlington Heights, both of Ill.

[73] Assignee: Zenith Radio Corporation, Glenview, Ill.

[21] Appl. No.: 195,998

[22] Filed: Oct. 10, 1980

[51] Int. Cl.³ .................. H03H 9/64; H03H 9/72
[52] U.S. Cl. .................... 333/195; 333/153; 333/194
[58] Field of Search .............. 333/150–155, 333/193–196; 310/313 R, 313 A, 313 B, 313 C, 313 D; 331/107 A; 358/1, 36, 38, 904, 905, 196

[56] References Cited

U.S. PATENT DOCUMENTS 3,983,517  9/1976  Weglein ............... 310/313 D X
4,048,594  9/1977  Weglein ............... 333/196 X
4,155,057  5/1979  Sandy et al. ......... 310/313 D

OTHER PUBLICATIONS

Parker et al.—"Acoustic Surface—Wave Bandpass Filters", Phillips Technical Review, vol. 36, 1976, No. 2, pp. 29–43.

Primary Examiner—Marvin L. Nussbaum

[57] ABSTRACT

In order to avoid spurious responses at the third harmonic of the signal frequency, a surface acoustic wave filter employs a multi-strip track coupler in which the spacing d of the elements is an integral multiple I of the acoustic wavelength λ of the third harmonic. When the condition $d = I\lambda$ is satisfied, the coupler blocks transmission of the third harmonic from the input transducer track to the output transducer track. This basic principle can also be used to block other frequencies.

12 Claims, 5 Drawing Figures

FIG. 3
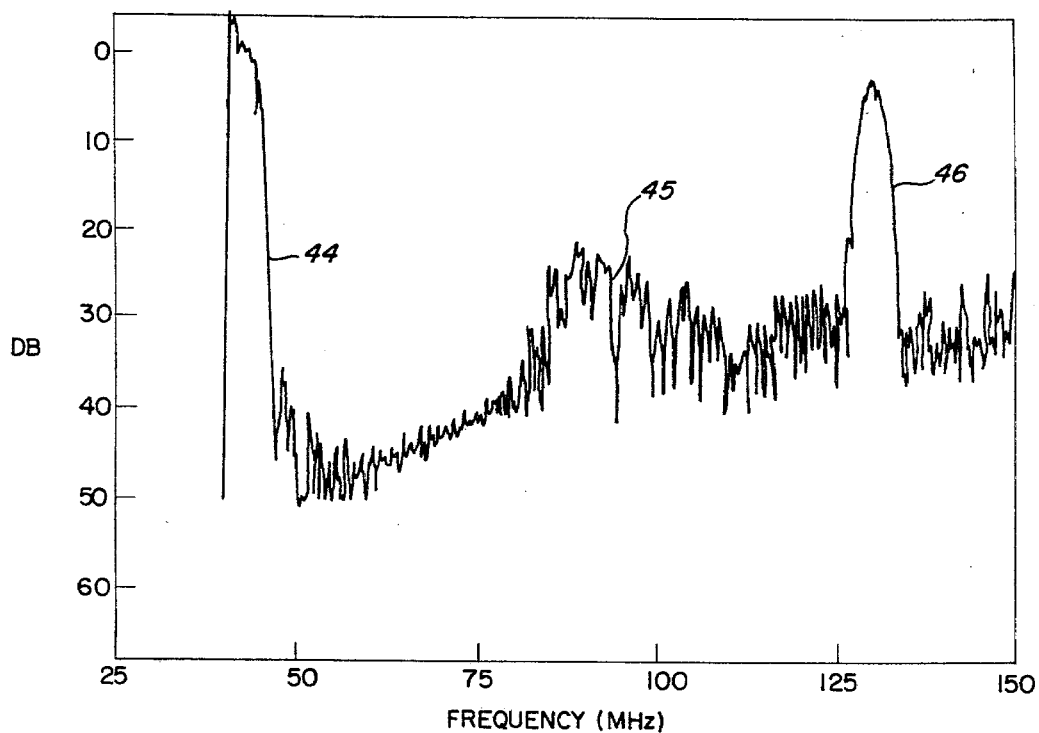
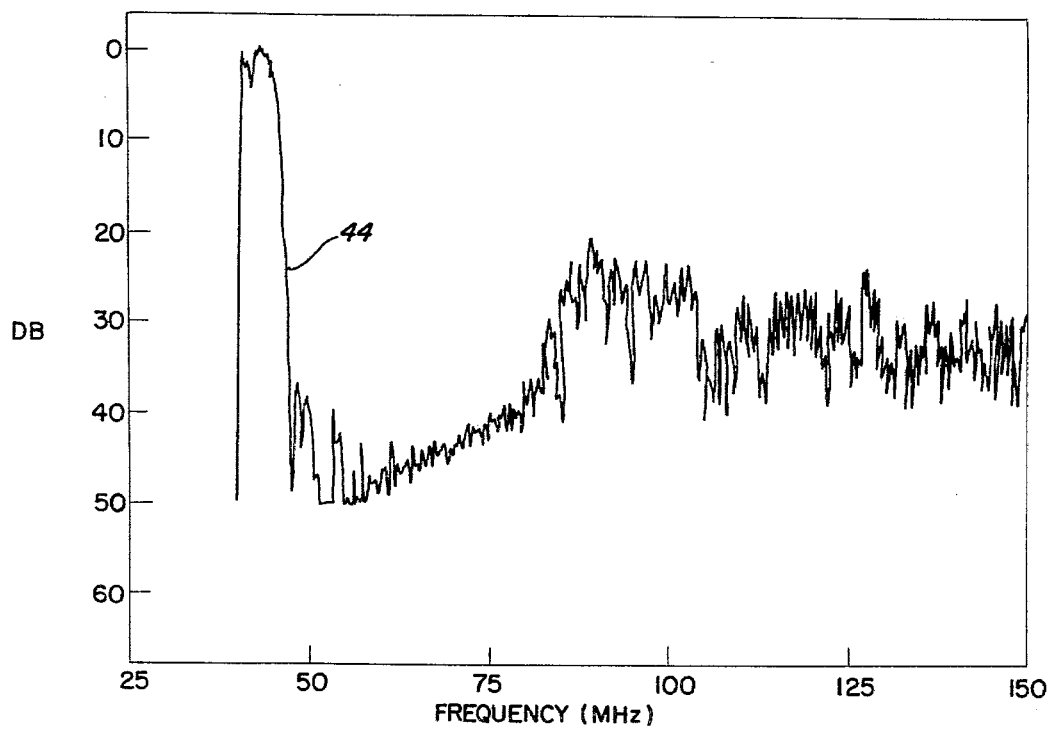
FIG. 4

ACOUSTIC FILTER WITH HARMONIC REJECTION

This invention relates generally to acoustic filter devices, and in particular to a surface wave integrable filter (S.W.I.F.) which rejects interference near the third harmonic of the intermediate frequency of a communications receiver.

BACKGROUND

Radio and television (T.V.) receivers of the superheterodyne type employ tunable local oscillators to convert all incoming radio frequency (R.F.) signals to a predetermined narrow intermediate frequency (I.F.) range. The I.F. section of a receiver can thus be optimally designed, because it always operates in that narrow frequency range regardless of which station or channel the receiver is tuned to. Because of this narrowband operation, such I.F. sections commonly employ bandpass filters which are sharply tuned to the intermediate frequency.

In the T.V. field, such I.F. bandpass filters are often of the surface acoustic wave type. These devices have the advantage of being manufacturable by integrated circuit techniques. They comprise a substrate which is usually made of a piezo-electric material (although other materials have been employed; see U.S. Pat. Nos. 3,609,252 and 3,678,305). Upon the substrate are an input transducer (i.e., one which is connected to the electrical input signal) and an output transducer (i.e., one which produces the electrical output of the filter). These transducers each consist of interdigitated electrically conductive elements connected by pairs of bus bars. Both the elements and the bus bars are printed on the surface of the substrate. The spacing of these elements determines the operating frequency of the filter. See "Acoustic Surface Waves" by Kino and Shaw, Scientific American, October 1972, p. 50, which described an I.F. filter of this type developed for broadcast T.V. reception by a group including one of the present inventors.

When the elements are of uniform length and equally spaced, such interdigital (I.D.) transducers are quite frequency-selective. Each separate pair of elements in the input transducer across which a signal voltage is connected generates a weak acoustic wave. It is only by providing a plurality of such acoustic generator pairs, properly spaced to achieve acoustic phase coherency, that significant signal levels can be achieved. Any given pair spacing meets the conditions for phase coherency only near a specific frequency or an odd harmonic thereof. Therefore such an input transducer inherently has a very selective frequency response characteristic. If the output transducer likewise has uniform length elements and a fixed pair spacing, it also can produce a significant output level only when energized at an acoustic frequency for which that spacing produces phase coherency. A surface wave device in which both the input and output transducers are designed to operate at the same fundamental frequency is therefore a highly selective filter.

Such filters, however, do have spurious responses near the odd harmonics of their fundamental frequency. This has on occasion caused problems in T.V. receivers, particularly when interference near the third harmonic of the intermediate frequency was not rejected by the surface acoustic wave filter, and did adversely affect picture quality. Thus, there is a need to immunize S.W.I.F. devices from interference generally, and particularly near the third or other odd harmonics of the I.F. used in T.V. receivers.

The input transducer of a S.W.I.F. device directs its acoustic wave output in a fairly narrow beam or "track". The output transducer is also quite directional, and receives only acoustic signals arriving on its "track". If the two transducers are arranged so that their tracks coincide, they will be acoustically coupled so that surface (Rayleigh) waves generated by the input transducer are received by the output transducer.

This coincident track arrangement, however, may also cause the output transducer to pick up undesired bulk mode acoustic waves. The latter come from the input transducer and travel in the direction of the input track, but instead of staying on the surface of the substrate they pass through the body of the substrate by way of an internally reflected path. In order to discriminate between surface waves and bulk modes, it is a common practice to put the two transducers on two separate but parallel tracks. A track coupler is then provided on the surface of the substrate to shift surface acoustic energy from the input track where it is generated by the input transducer to the output track where it can be received by the output transducer. The track coupler, being a surface wave device, has no track coupling effect on the bulk wave. The latter, therefore, remains aligned with the input track where it cannot be detected by the output transducer. See, for example, "Surface Wave Filters," edited by Herbert Matthews, Chapter 6, "Surface Wave Bandpass Filter," by A. DeVries, published by John Wiley, New York City.

A known form of track coupler comprises a plurality of spaced electrically conductive strip elements without any bus bars connecting them together (i.e. a "multistrip coupler" or M.S.C.). If the strips extend transversely across the width of two tracks, acoustic energy will be transferred laterally from one track to the other at certain spatially periodic locations. If the output transducer is located at one of the peaks of this spatial pattern, energy which starts out on one track can be effectively recaptured on the other.

There are some similarities, and also some important differences, between the operation of an M.S.C. and that of an I.D. transducer. Each neighboring pair of coupler strips of an M.S.C. forms an elemental transducer. An incoming acoustic wave induces a potential between these strips on the track where that wave arrives. Because the strips are conductive, the same potential exists all along the strip length, including the parallel track, where the potential is effective to regenerate acoustic energy. As in the design of an I.D. transducer, an M.S.C. employs multiple elements so that their individual outputs add up to useful levels. But an M.S.C., unlike an I.D. transducer, is not limited to a narrow frequency range determined by the element spacing.

As described by Marshall, Newton and Paige in their paper, "Theory and Design of the Surface Acoustic Wave Multistrip Coupler," I.E.E.E. Transactions on Sonics and Ultrasonics, April, 1973, p. 124, an M.S.C. operates over a broad band of frequencies. The mode of operation of an M.S.C. is different in this respect from that of an I.D. transducer. Because the M.S.C. does not have bus bars tying the voltages of alternate elements together, the phase relationship between them is governed by the incoming acoustic wave. Consequently the elements of an M.S.C. automatically match their phase relationships to that of the incoming wave even over a range of acoustic wavelengths which do not have a sharply defined relationship to the element spacing. The coupling efficiency of an M.S.C. for a given frequency does vary as a function of element spacing, but it does not drop off dramatically as in the case of a narrow band I.D. transducer. Therefore within certain limits an M.S.C. is quite tolerant of frequency changes.

An upper frequency limit for the M.S.C. is reached, in the view of Marshall, et al., supra, only when the operating frequency f approaches a value $f_o = v/2d$, where v is the surface acoustic wave velocity of the substrate and d is the spatial periodicity of the M.S.C. elements.

Thus the choice of element periodicity in a M.S.C. has not been thought of as a design consideration in terms of center frequency, as it is in the case of an I.D. transducer. It has been thought of as a design consideration only in terms of the upper frequency cut-off. When the $f_o = v/2d$ condition is approached, acoustic reflections bounced back along the input track from the elements of the M.S.C. toward the input transducer begin to add constructively. As a result, too much of the acoustic energy is reflected and not enough is coupled to the output track. This blocks the operation of the S.W.I.F. device.

This invention recognizes that there is another gap in the coupler response when the spacing of the elements thereof is an integral multiple of an acoustic signal wavelength (i.e., $d = I\lambda$ where I is any positive integer). Under this condition (which corresponds to a frequency in excess of $f_o$) the coupler has zero track coupling efficiency. Superficially, this appears to be a stopband similar to that of Marshall, et al., resulting from the periodicity of the M.S.C. elements. But, after careful analysis, it is realized that the effect upon which this invention rests is fundamentally different from the stopband effect previously described by Marshall et al. Marshall's $f_o = v/2d$ stopband results from the effect of echoes reflected backward along the input track. But the $d = I\lambda$ stopband recognized herein results from an entirely different phenomenon: the fact that the potential between neighboring fingers of the M.S.C. is zero at any frequency f for which the element spacing d is one, two, three, or any other integral number I times the surface acoustic wavelength. Moreover the stopband caused by this mechanism is typically much wider and deeper than that of Marshall et al.

With proper choice of the M.S.C. element spacing d, the filter can be designed so that the stopband conditions $d = I\lambda$ exist at or near any desired frequency f having a wavelength of $\lambda$. If it is particularly desired to suppress the nth harmonic $f_n$ of a fundamental response frequency $f_s = f_n/n$, then d would be set equal to $I\lambda_n$, where $\lambda_n$ is the wavelength of the nth harmonic and equals $v/f_n$. But it is important to note that even when stopband conditions $d = I_n\lambda_n$ exist for the nth harmonic frequency $f_n$, stopband conditions $d = I_s\lambda_s$ need not exist for the signal frequency $f_s$ itself. Thus the filter can discriminate effectively between the signal frequency $f_s$ and a frequency at or near its nth harmonic $f_n$. If a filter for a T.V. receiver, d can be chosen so that $f_s$ is the intermediate frequency, and $f_n$ is the third harmonic $f_3 = 3f_s$. The filter will then reject the 3rd harmonic without rejecting the I.F. signal.

These and other features, objects and advantages of the invention will be more fully appreciated from the detailed description of the invention which follows, when read in conjunction with the drawings which accompany this specification.

DRAWINGS

FIG. 3 is a frequency response curve of a prior art S.W.I.F. which has a significant near-third harmonic passband.

FIG. 4 is a comparable curve for the S.W.I.F. of this invention.

DETAILED DESCRIPTION OF THE PREFERRED EMBODIMENT

Figure 1:
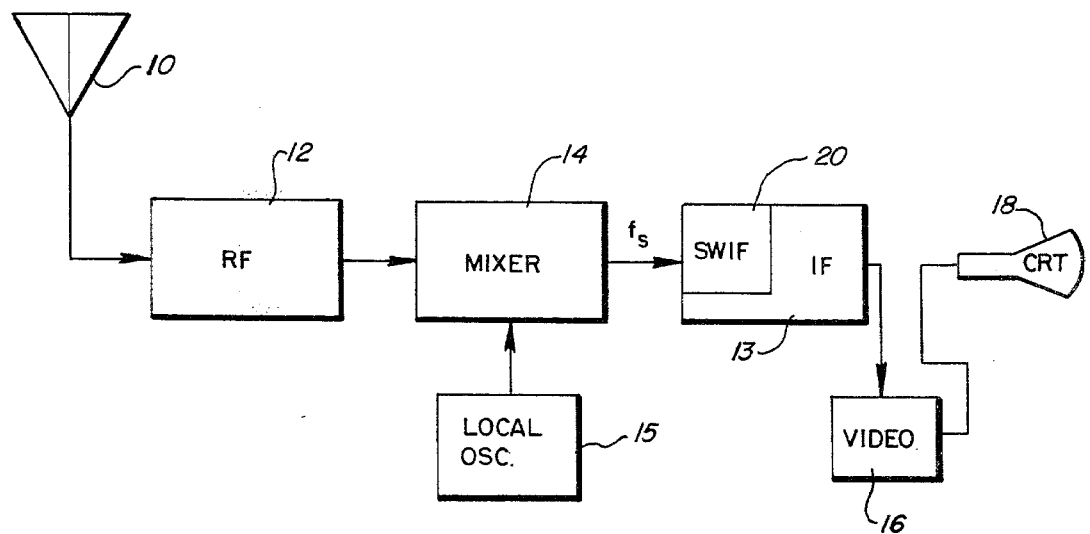
FIG. 1 is a simplified functional block diagram of a video receiver employing a S.W.I.F. device in accordance with this invention.

In very simple terms, a superheterodyne video receiver (seen in FIG. 1) comprises an antenna 10 which picks up an R.F. signal, an R.F. section 12 which detects that signal, a mixer 14 which beats that signal against the output of a tunable local oscillator 15 to produce a signal output at a fixed intermediate frequency $f_s$, an I.F. section 13 comprising a surface wave integrable filter 20 which processes the I.F. signal, a video section 16 which responds to the I.F. signal, and a cathode ray tube (C.R.T.) 18 which is driven by the video section to produce a T.V. picture. As is common in the art, the S.W.I.F. 20 is designed to operate in a narrow passband centered on the intermediate frequency $f_s$ in order to narrow the frequency response of the I.F. section 14.

Figure 2:
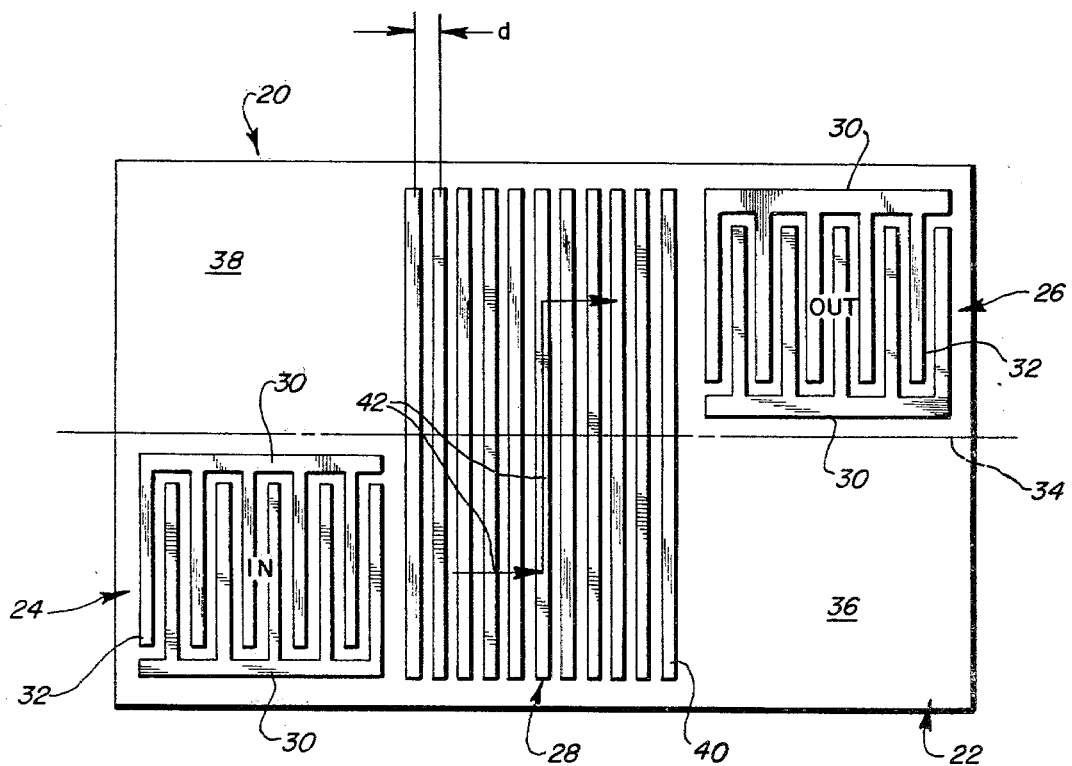
FIG. 2 is a schematic representation of the S.W.I.F. of this invention, which is designed to discriminate between a video I.F. signal and interference near the third harmonic thereof.

As seen in FIG. 2, such devices commonly include a substrate 22 made of a piezo-electric material such as crystalline lithium niobate ($LiNbO_3$). Printed on one surface of the substrate are metal lines comprising an input I.D. transducer 24, an output I.D. transducer 26, and an M.S.C. 28. Each transducer comprises a pair of bus bars 30 from which extend interdigitated fingers 32. The input electrical signal is connected across the bus bars 30 of the input transducer 24, and the output electrical signal is taken across the bus bars 30 of the output transducer 26. In a practical device the input transducer 24 would likely be "apodized," or provided with length-weighted fingers 32 to tailor its frequency response to the particular application. In addition, one or both of the transducers might have fingers 32 of the "split-connected" type (not shown), in order to minimize undesired surface acoustic reflections.

As is commonly done to avoid bulk wave effects, the surface of the substrate 22 is divided (by an imaginary line 34) into two separate regions or tracks 36 and 38 respectively. The input transducer 24 beams substantially all of its acoustic output along the input track 36, while the output transducer 26 is adapted to receive substantially all of its acoustic input from the output track 38. The M.S.C. 28 comprises a large number of parallel elements such as strips 40 (without bus bars), each extending transversely across both tracks 36 and 38, and spaced from each other by an average center-to-center distance d. The element spacing may or may not be the same for each pair of neighboring elements 40 within the coupler 28. Some coupler designs are known in which the spacing varies around an average value. Thus for present purposes d is defined as the average element spacing. The elements may also take other forms beside the strip configuration illustrated herein, provided they retain some average spacing d.

As indicated by the zig-zag path of arrows 42, the M.S.C. 28 intercepts the surface acoustic wave signal emitted by input transducer 24 and transfers it efficiently from the input track 36 to the output track 38, where it can be received by the output transducer 26. See U.S. Pat. No. 3,836,876. Bulk mode acoustic waves emitted by the input transducer 24, however, descend into the depth of the substrate 22 below the M.S.C. 28 and thus escape the M.S.C. They re-emerge to surface level further along the input track 36, beyond the M.S.C., after being reflected internally from the opposite surface of the substrate 22. But since the output transducer 30 is on another track, it is not influenced by the reflected bulk mode energy. Hence, one purpose of the M.S.C. 28, as is known to the prior art, is to shift tracks in order to discriminate between surface and bulk waves.

The present invention allows the M.S.C. to be used to perform a second task simultaneously. It can be used to discriminate between the S.W.I.F. fundamental frequency $f_s$ and another frequency, such as one near the nth harmonic $f_n$ thereof. Prior art surface acoustic wave filters respond not only to their fundamental design frequency, but also to an odd harmonic thereof $f_n = nf_s$ where n = any odd positive integer 1, 3, 5, etc. While the spacing of the pairs of transducer fingers 32 makes both transducers 24 and 26 highly selective for $f_s$, it does not enable them to discriminate against odd harmonics thereof. Nor did the M.S.C. devices of the prior art discriminate against odd harmonics, because the $f_o$ stopband discussed by Marshall et al. occurs only at frequencies between $f_s$ and its lowest odd harmonic (the third harmonic $3f_s$).

The particular spurious response frequency which presents the greatest problem in a video receiver is near the I.F. third harmonic $3f_s$. FIG. 3 depicts the measured frequency response (in dB) of a prior art S.W.I.F. having a fundamental passband 44 centered on a video I.F. signal frequency $f_s = 45$ MHz. There is also a relatively small spurious response band 45 near 90 MHz (which is thought to be caused by longitudinal acoustic modes), and a more significant spurious response band 46 near the I.F. third harmonic (specifically from about 127 to about 134 MHz). Interference in ranges 45 and 46 can degrade video quality. The use of 50% duty cycle single transducer fingers 32 are illustrated, instead of the split configuration, call alleviate the problem of third harmonic interference; but single fingers have the disadvantage of being more reflective, producing acoustic echoes which often result in objectionable ghost images on the T.V. screen.

In accordance with this invention, the spacing d of the elements 40 is selected to make the M.S.C. 28 ineffective as a track coupler at or near any desired frequency, such as one of the spurious response bands 45 and 46. In the particular exemplary embodiment described in detail herein, the M.S.C. is designed to reject frequencies near the third harmonic frequency $f_3 = 3f_s$; while permitting it to remain effective as a track coupler at the fundamental signal frequency $f_s$ itself.

The basic principle involved is that an M.S.C. with an average periodicity of d will not couple a signal which has a surface acoustic wavelength $\lambda$ such that $d = I\lambda$, where I is any positive integer 1, 2, 3, etc. If any undesired frequency $f_n$ is to be rejected, the condition to be satisfied is $d = I_n\lambda_n$ where $I_n$ is a selected positive integer. But in order for the signal frequency $f_s$ not to be rejected, one must simultaneously avoid the condition $d = I_s\lambda_s$ where $I_s$ is another positive integer.

Figure 5:
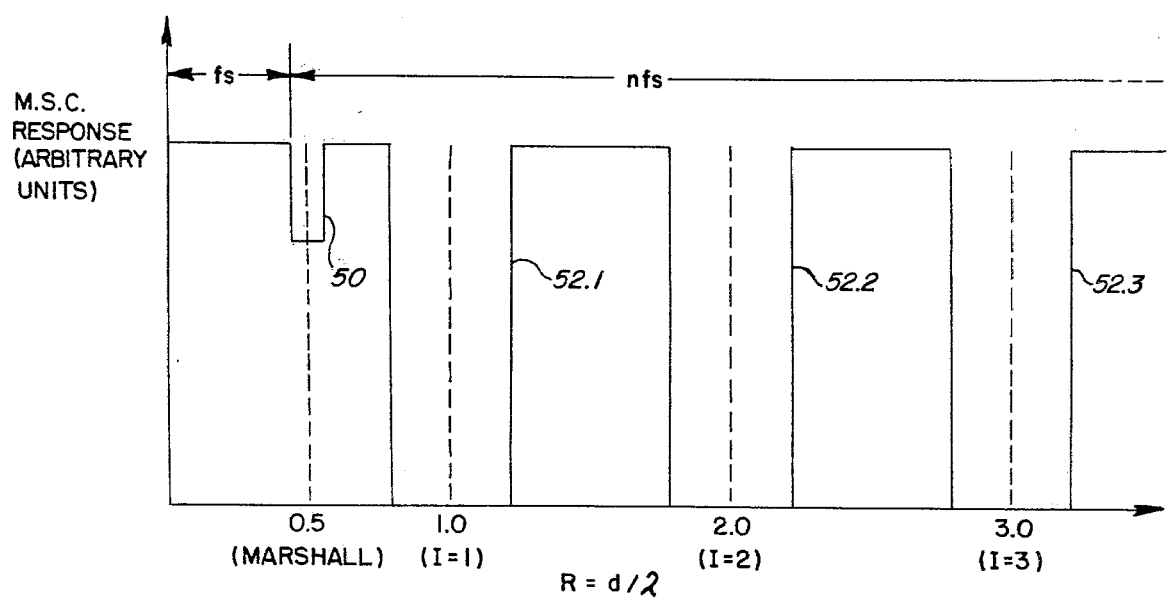
FIG. 5 is a diagram showing how the response of a track coupler varies as a function of the relationship between acoustic wavelength and coupler element spacing.

FIG. 5 illustrates qualitatively what happens to the response of an M.S.C. having an element spacing d, as the acoustic wavelength $\lambda$ changes so that a dimensionless quantity R varies over a range from below 0.5 to any positive value including integers 1, 2, 3, etc.; where R is defined as the ratio $d/\lambda$ (i.e. the element spacing divided by the acoustic wavelength). At a value $R = 0.5$ the coupler response has a dip 50 which is readily identified as the stopband at $f_o = v/2d$ previously recognized by the prior art. To appreciate this, consider that if $f_o = v/2d$, then since $V = \lambda_o f_o$, it follows that $f_o = \lambda_o f_o/2d$, which reduces to $d/\lambda_o = \frac{1}{2}$. Thus under Marshall (prior art) stopband conditions $d/\lambda = R = 0.5$.

At each positive integral value of R there is another stopband 52.1 at $R = 1.0$, 52.2 at $R = 2.0$, 52.3 at $R = 3.0$, etc. These stopbands 52, which are each wider and deeper than the Marshall stopband 50, correspond to the condition $d = I\lambda$ for respective integral values $I = 1$, 2, 3, etc. As Marshall et al. point out, it is preferable to put the fundamental filter frequency $f_s$ in the region where R is below 0.5. When this is done, then harmonics $nf_s$ thereof (for all integral values of n) will fall in the region where R exceeds 0.5. This diagram, therefore, demonstrates two conclusions: first, that the stopbands 52 of this invention are distinct from stopband 50 of Marshall et al.; and second, that it is a simple matter to choose the element spacing d of track coupler 28 such that any desired operating frequency $f_s$ will be below the stopband region $R = 0.5$, 1.0, 2.0, etc., while some higher interference frequency (such as harmonic $nf_s$) will be within that region and therefore amenable to rejection by a properly designed track coupler.

The filter designer may choose among the various integral values of R in the following manner. If the frequency to be rejected is the third harmonic $3f_s$, then the following table illustrates the first few choices of R values, where $R_s$ is the value of R for the signal frequency $f_s$ and $R_3$ is the R value for the third harmonic $3f_s$:

| $R_s$ | $R_3$ |
|---|---|
| 0.33 | 1 |
| 0.67 | 2 |
| 1 | 3 |
| 1.33 | 4 |

Thus, a coupler designed to reject $f_3$ must have a value $R_3 = 1, 2, 3$ or 4, etc.; and the corresponding value of $R_s$ will then be $\frac{1}{3}$ of $R_3$ ($R_s = 0.33$, 0.67, or 1, etc.). Since it is desirable to keep $f_s$ below the Marshall stopband 50, $R_s$ should be less than 0.5. Only the first pair of R values ($R_s = 0.33$, $R_3 = 1$) in the table above can meet this requirement. Therefore d is chosen so that $R_3 = 1$ (i.e. the R value $d/\lambda$ for the third harmonic $3f_s$ must be one).

Higher order harmonics appear to give a greater range of choices for the R value of the rejected harmonic. Thus a similar table for the next higher order odd harmonic $f_5 = 5f_s$ is as follows:

| $R_s$ | $R_5$ |
|---|---|
| 0.2 | 1 |
| 0.4 | 2 |
| 0.6 | 3 |
| 0.8 | 4 |
| 1.0 | 5 |

Here, since $R_s$ is only 1/5 of $R_5$, the first *two* pairs of R values will meet the condition $R_s < 0.5$. But even here the first pair of R values is preferred, because smaller R values imply a smaller spacing d between the elements 40 of coupler 28, and thus smaller dimensions for the entire filter 20. Since the LiNbO$_3$ material of the substrate 22 is fairly expensive, coat savings can be effected by employing the lowest pair of R values available.

In a specific practical embodiment of a S.W.I.F. designed to pass a video I.F. signal of 45 MHz while rejecting interference near the I.F. third harmonic, the M.S.C. 28 was provided with eighty elements 40 spaced apart by a distance of d=27.56 μm. This spacing is equal to the lithium niobate surface acoustic wavelength at a frequency of 125 MHz, which is somewhat below the third harmonic of the I.F. signal. This places the rejection band in the 127 to 134 MHz spurious passband range 46. The measured frequency response of this device is shown in FIG. 4. Note that there is no significant response in the third harmonic region. The spurious peak 46 of FIG. 3 has been reduced by more than 20 dB.

Some compromises are involved in the above design. The design of the coupler 28 adds a few tenths of a dB to the insertion loss of the filter 20, as compared to prior art devices. Also, eighty lines 40 is less than optimal in the design of the coupler, but represents a trade-off between losses on the one hand and use of expensive piezo-electric material on the other.

The parameter which is varied to satisfy the design conditions is d, the average element spacing, because (unlike I.D. transducers 24 and 26) the M.S.C. 28 has a relatively broad fundamental frequency response with respect to changing values of this parameter. The only restriction of the choice of d is that the Marshall et al. stopband frequency $f_o = v/2d$ must not be equal to the signal frequency $f_s$. The Marshall stopband condition is equivalent to $d = v/2f_o = \lambda_o/2$ where $\lambda_o$ is the acoustic wavelength at the Marshall stopband frequency. Thus the condition to be avoided is obtained by comparing Marshall's critical spacing value $d = \lambda_o/2$ to the present critical spacing value $d = I\lambda_n = I\lambda_s/n$ where I is an integer and $\lambda_s$ and $\lambda_n$ are the surface acoustic wavelengths of the signal frequency $f_s$ and its nth harmonic $f_n$ respectively. If $f_o$ were equal to $f_s$, we could equate these two values for d, giving $\lambda_o/2 = I\lambda_s/n$. In addition, if $f_o = f_s$, then $\lambda_o = \lambda_s$. Therefore $\lambda_o/2 = I\lambda_o/n$ which implies $I = n/2$, an impossibility when n is odd, since I must be an integer. Therefore whenever the rejected frequency $f_n$ is an odd harmonic of the signal frequency $f_s$, it is impossible for the latter to fall within the Marshall stopband.

It will now be appreciated that this invention provides a filter with spurious response suppression characteristics. The filter employs a stopband located at a higher frequency than the previously recognized stopband; and employs a multi-strip coupler designed according to novel parameters. Such a coupler does double duty, by both coupling tracks and suppressing interference at frequencies above the signal frequency. A T.V. set employing such a filter enjoys enhanced picture quality, free from interference in a spurious response band such as that which is near the third harmonic of the I.F.

The described embodiments represent the preferred form of the invention, but alternative embodiments may be imagined which would come within the novel teachings herein. Accordingly, these embodiments are to be considered as merely illustrative, and not as limiting the scope of the following claims.

We claim:

1. In a surface acoustic wave component including a substrate divisible into at least two surface regions, input surface acoustic transducing means capable of efficiently transmitting surface acoustic waves of first and second frequencies to a first but not a second one of said regions, output surface acoustic transducing means capable of receiving said waves in said second but not said first region, and means having an average periodic structure for coupling acoustic waves of said first frequency from said first to said second region; the improvement wherein:

said coupling means inefficiently couples an acoustic signal when said average periodicity of said coupling means is an integral number of surface acoustic wavelengths of said signal on said substrate;

and said average periodicity is substantially equal to an integral number of surface acoustic wavelengths of said second but not said first frequency on said substrate.

2. A component as in claim 1 wherein said coupling means comprises a plurality of electrically conductive elements each coupled to both of said substrate regions, and said periodicity comprises the distance between said elements.

3. A surface acoustic wave filter having a fundamental pass frequency of f and comprising:

a substrate having a surface divisible into at least two substantially parallel tracks;

input surface acoustic wave transducing means capable of transmitting bulk and surface acoustic waves including a signal frequency and an interference frequency on a first but not on a second one of said tracks;

output surface acoustic wave transducing means capable of receiving bulk and surface acoustic waves of said signal and interference frequencies on said second but not on said first track;

and track coupling means arranged for coupling surface acoustic waves of said signal frequency, but neither bulk acoustic waves nor surface acoustic waves of said interference frequency, from said first to said second track.

4. A filter as in claim 3 wherein said track coupling means comprises:

a plurality of electrically conductive elements coupled to both of said tracks and spaced from each other along the axes of said tracks by an average distance at least roughly equal to an integral number of surface acoustic wavelengths of said interference frequency on said substrate.

5. In a superheterodyne communications receiver having a section adapted to receive a range of radio frequencies and a section adapted to operate at a fixed intermediate frequency, said intermediate frequency section including a surface acoustic wave filter having a fundamental passband which includes said intermediate frequency; the improvement wherein said filter comprises:

a substrate, the surface of which is divisible into at least two regions;

input and output surface acoustic wave transducing means on said substrate;

said input transducing means being effective within a first one of said regions;

said output transducing means being effective within a second one of said regions;

and means on said substrate acoustically coupling said transducing means to each other, said coupling means comprising multiple elements having an average spacing at least roughly equal to an integral number of surface acoustic wavelengths on said substrate of a selected interference frequency outside said passband, whereby said coupling means is adapted to reject said interference frequency.

6. A receiver as in claim 5 wherein said interference frequency is at or near an odd harmonic of said intermediate frequency.

7. A receiver as in claim 6 wherein said intermediate frequency is in the neighborhood of 45 MHz and said spacing is substantially equal to an integral number of wavelengths of a surface acoustic frequency of 125 MHz on said substrate, whereby to reject a near third harmonic spurious response in the frequency range from about 127 to about 134 MHz.

8. A surface acoustic wave device responding efficiently to a signal frequency and comprising: at least two substantially parallel tracks and means for coupling said tracks having a plurality of electrically conductive elements with an average space periodicity at least roughly equal to an integral number of surface acoustic wavelengths of an interference frequency.

9. A device as in claim 8 wherein said interference frequency is higher than said signal frequency.

10. A device as in claim 9 wherein said interference frequency is at or near the nth harmonic of said signal frequency.

11. A device as in claim 10 wherein n is an odd number.

12. A device as in claim 11 wherein n=3.

* * * * *